(12) United States Patent
Chiba

(10) Patent No.: US 6,677,803 B1
(45) Date of Patent: Jan. 13, 2004

(54) SEMICONDUCTOR INTEGRATED CIRCUIT DEVICE

(75) Inventor: Tadashi Chiba, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/224,420

(22) Filed: Aug. 21, 2002

(51) Int. Cl.[7] .................................................. G06G 7/24
(52) U.S. Cl. ....................................................... 327/534
(58) Field of Search ................................ 327/530, 534, 327/535, 537

(56) References Cited

U.S. PATENT DOCUMENTS

| | | | |
|---|---|---|---|
| 5,559,368 A | * 9/1996 | Hu et al. ...................... | 257/369 |
| 5,644,266 A | * 7/1997 | Chen et al. .................. | 327/534 |
| 5,786,724 A | * 7/1998 | Teggatz ........................ | 327/534 |
| 6,304,110 B1 | * 10/2001 | Hirano ......................... | 327/108 |
| 6,469,568 B2 | * 10/2002 | Toyoyama et al. .......... | 327/534 |
| 6,515,534 B2 | * 2/2003 | Dabral ......................... | 327/534 |

OTHER PUBLICATIONS

J.L. Pelloie et al., "SOI Technology Performance and Modeling" 1999 IEEE International Solid–State Circuits Conference.

* cited by examiner

Primary Examiner—Jeffrey Zweizig
(74) Attorney, Agent, or Firm—Volentine Francos, PLLC

(57) ABSTRACT

A semiconductor integrated circuit device which has a low power consumption in a static state. A first NMOS transistor includes a gate connected to an input, a source connected to ground, and a drain connected to an output. A second NMOS transistor includes a gate connected to the power supply, and a drain and source, one connected to the input terminal and the other to the first NMOS transistor's body. A first PMOS transistor includes a gate connected to the input, a source connected to a power supply, and a drain connected to the output. A second PMOS transistor includes a gate connected to ground, and a drain and source, one connected to the input terminal and the other to the first PMOS transistor's body. Also, the second NMOS transistor's body is connected to ground, or the second PMOS transistor's body is connected to $V_{DD}$, or both.

5 Claims, 18 Drawing Sheets

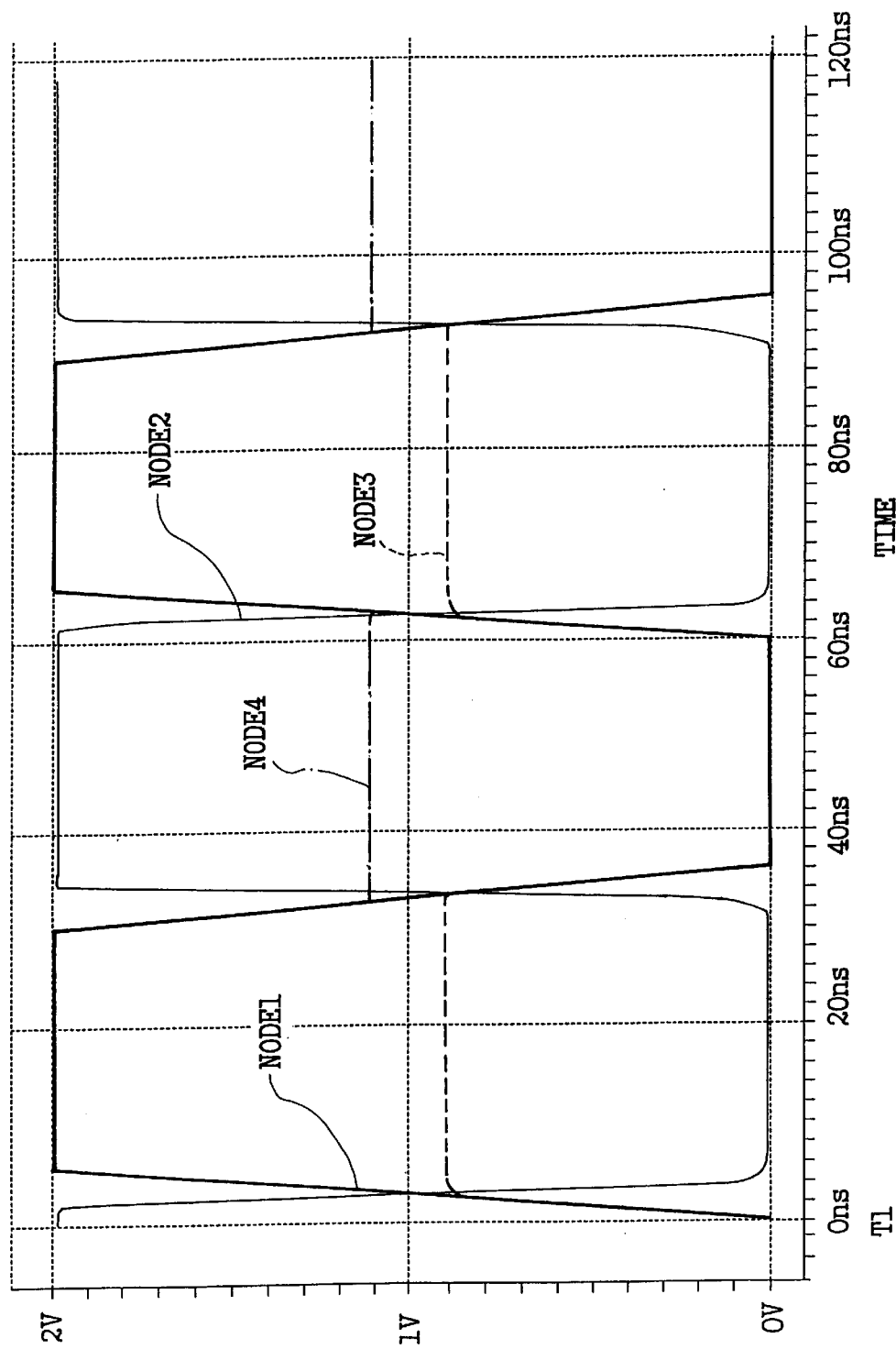

US 6,677,803 B1

SEMICONDUCTOR INTEGRATED CIRCUIT DEVICE

BACKGROUND OF THE INVENTION

1. Field of the Invention

The present invention relates to a semiconductor integrated circuit device and, in particular, to a semiconductor integrated circuit device of low power consumption.

2. Description of the Related Art

In recent years, a steady progress has been made in enhancing high packing density and high performance of LSIs and the field of application of the LSIs have been expanded. In accordance with the expansion of the field of application, technical challenges such as reducing the power consumption of the LSI and increasing the operating speed of the circuit of the LSI are presented. In a CMOS-LSI, the power consumption is proportional to the square of a power supply voltage and thus reducing the power supply voltage is the most effective means for reducing the power consumption. However, if the power supply voltage is reduced, the operating speed of the CMOS-LSI is reduced. Therefore, in order to keep the operating speed, the threshold voltage of a MOS transistor needs to be reduced. Reducing the threshold voltage leads to a problem of increasing a leakage current caused by the sub-threshold current of the MOS transistor in a static operation. In order to solve this problem, a Dynamic Threshold Metal Oxide Semiconductor (hereinafter referred to as DTMOS) is proposed in which the threshold voltage of the MOS transistor is dynamically varied, thereby to reduce a leakage current in the static operation and to realize a high speed operation. For example, as a paper to describe the result of research using a DTMOS as a SOI device, there is an article titled "SOI Technology Performance and Modeling" authored by J. L. Pelloie, A. J. Auberton-Herv, C. Raynaud, O. Faynot, IEEE, WP25.2, 1999.

In FIG. 14, a circuit of a DMOS-NMOS transistor with a transistor for limiting a body voltage in the related art, which is described in the above article, is shown. This DTMOS transistor in the related art is constituted by: an NMOS transistor N1 in which a node 1 of an input terminal is connected to a gate, a node 2 of a GND line is connected to a source, and a node 3 is connected to a drain; and an NMOS transistor N2 in which a node 4 is connected to a power supply line is connected to a gate, the node 1 is connected to a drain (or a source), and a node 5 of the body of the NMOS transistor N1 is connected to a source (or a drain). In the DTMOS transistor in the related art, as shown in FIG. 14, the NMOS transistor N2 prevents a voltage larger than a built-in voltage (for example, 0.8 V) from being applied to the node 5 which is a back (substrate voltage terminal) of the NMOS transistor N1 in other words, acts as a "limiter" of preventing a voltage larger than the built-in voltage from being applied to a body voltage terminal. For this reason, a junction leakage current passing through the node 5 and the node 2 can be reduced. Although not described in the above article, also the DTMOS-PMOS transistor with a transistor for limiting a body voltage, shown in FIG. 15, can produce the same effect as an NMOS type DTMOS transistor circuit.

However, since the electric potential of the body of the NMOS transistor N2 is not fixed at a GND level in the DTMOS-PMOS transistor with a transistor for limiting a body voltage in the related art shown in FIG. 14, if a large voltage (for example, 1.5 V) is applied across the source and the drain, holes generated by an impact ionization phenomenon generated in the vicinity of the drain of the NMOS transistor N2 are flowed into a portion (hereinafter referred to as a body region) in the vicinity of a buried oxide film under a gate channel to increase the electric potential of the body region. As a result, this increases the junction leakage current between the body of the NMOS transistor N2 and the node 5 or the node 1 of the NMOS transistor N1. This results in presenting a problem that a current consumption is increased in the static operation. The current-voltage characteristics of the NMOS transistor N2 are shown in FIG. 18A, in which the drain current is increased by the phenomenon described above when the drain voltage is large. Similarly, the current-voltage characteristics of the PMOS transistor P2 are shown in FIG. 18B, in which a drain current is increased by the phenomenon described above when a drain voltage is large.

In FIG. 16, an inverter circuit constituted by one NMOS type DTMOS transistor with a function for limiting a body voltage and one PMOS type DTMOS transistor with a function for limiting a body voltage in the related art is shown. This inverter circuit constituted by the DTMOS transistors in the related art is constituted by: an NMOS transistor N1 in which a node 1 of an input terminal is connected to a gate, a GND line is connected to a source, and a node 2 is connected to a drain of an output; an NMOS transistor N2 in which a power supply line is connected to a gate, the node 1 is connected to a drain (or a source), and a node 3 of the body of the NMOS transistor N1 is connected to a source (or a drain) ; a PMOS transistor P1 in which the node 1 of an input terminal is connected to a gate, the power supply line is connected to a source, and the node 3 is connected to a drain of an output; and a PMOS transistor P2 in which the GND line is connected to a gate, the node 1 is connected to a drain (or a source), and a node 4 of the body of the PMOS transistor P1 is connected to a source (or a drain).

In FIG. 17, the operation waveforms of the node 1, the node 2, the node 3 and the node 4 of the DTMOS inverter circuit shown in FIG. 16 are shown. A voltage larger than the built-in voltage is applied as an input voltage. When the node 1 is at the GND level (that is, the electric potential of the node 1 is GND) at a time T1, both of the NMOS transistor N1 and the NMOS transistor N2 are in the OFF state and both of the PMOS transistor P1 and the PMOS transistor P2 are in the ON state. Therefore, the node 2 and the node 3 are set at the power supply (voltage) level. The voltage of the node 4 is limited by the PMOS transistor P2 and thus the node 4 is set at the built-in voltage level.

During a period of time from T2 to T3, while the voltage of the node 1 gradually reaches from the GND level to the power source level, the NMOS transistor N1 and the NMOS transistor N2 gradually reach the state of ON and the PMOS transistor P1 gradually reach the state of OFF. During this period of time, the node 3 being at the power source level gradually reaches to the GND level. Further, because the PMOS transistor P2 is in the ON state, as the node reaches a VDD level, the node 4 is increased gradually to the VDD level.

At the time T4, when the node 1 is at the VDD level, the NMOS transistor N1 and the NMOS transistor N2 are in the ON state and the PMOS transistor P1 and the PMOS transistor P2 are in the OFF state. At this time, the node 2 and the node 4 are at the GND level. The voltage of the node 3 is limited by the NMOS transistor N2 and thus the node 3 is set at the built-in voltage level when viewed from the VDD level.

During a period of time from T5 to T6, while the voltage of the node 1 gradually reaches from the power source level to the GND level, the NMOS transistor N1 and the NMOS transistor N2 gradually reach the state of OFF and the PMOS transistor P1 and the PMOS transistor P2 gradually reach the state of ON. During this period of time, because the NMOS transistor N2 is in the ON state, as the node 1 reaches the GND level, the node 3 being at the built-in voltage level is gradually lowered to the GND level.

Here, at the time T3, the node 1 is at the VDD level and the node 3 is at the built-in voltage level, so the potential difference between the node 1 and the node 3, that is, the potential difference between the source and the drain of the NMOS transistor N2 is equal to the difference between the power source level and the built-in voltage level. In this state, in the NMOS transistor N2 shown in FIG. 16, there is the tendency that the junction leakage current increases, which results in presenting a problem that the power consumption increases in a direct current state.

Further, similarly, at the time T1, the node 1 is at the GND level and the node 4 is at the built-in voltage level viewed from the power source level, so the potential difference between the node 1 and the node 4, that is, the potential difference between the source and the drain of the PMOS transistor P2 is equal to the difference between the GND level and the built-in voltage level when viewed from the power source level. In this state, in the PMOS transistor P2 shown in FIG. 16, the junction leakage current increases, which results in presenting a problem that the power consumption increases in the static state. As a result, the DTMOS inverter circuit in the related art raises a problem that the power consumption increases in the static state.

SUMMARY OF THE INVENTION

It is the object of the present invention to realize a semiconductor integrated circuit device which can solve the above problems and reduce power consumption and be operated at high operating speed without increasing a leakage current.

In order to achieve the above object, according to a first aspect of the present invention, there is provided a semiconductor integrated circuit device comprising: a first NMOS transistor (N1) in which a first node of an input terminal is connected to a gate, a GND line is connected to a source, and a second node is connected to a drain of an output; a second NMOS transistor (N2) in which a power supply line is connected to a gate, the first node is connected to one of a drain and a source, and a third node of the body of the first NMOS transistor (N1) is connected to the other of the drain and the source; a first PMOS transistor (P1) in which the first node of an input terminal is connected to a gate, the power supply line is connected to a source, and the third node is connected to a drain of an output; and a second PMOS transistor (P2) in which the GND line is connected to a gate, the first node is connected to one of a drain and a source, and a fourth node of the body of the first PMOS transistor (P1) is connected to the other of the drain and the source, wherein the GND line is connected to the body of the second NMOS transistor (N2).

In order to achieve the above object, according to a second aspect of the present invention, there is provided a semiconductor integrated circuit device comprising: a first NMOS transistor (N1) in which a first node of an input terminal is connected to a gate, a GND line is connected to a source, and a second node is connected to a drain of an output; a second NMOS transistor (N2) in which a power supply line is connected to a gate, the first node is connected to one of a drain and a source, and a third node of the body of the first NMOS transistor (N1) is connected to the other of the drain and the source; a first PMOS transistor (P1) in which the first node of an input terminal is connected to a gate, the power supply line is connected to a source, and the third node is connected to a drain of an output; and a second PMOS transistor (P2) in which the GND line is connected to a gate, the first node is connected to one of a drain and a source, and a fourth node of the body of the first PMOS transistor (P1) is connected to the other of the drain and the source, wherein a VDD line is connected to the body of the second NMOS transistor (N2).

In order to achieve the above object, according to a third aspect of the present invention, there is provided a semiconductor integrated circuit device comprising: a first NMOS transistor (N1) in which a first node of an input terminal is connected to a gate, a GND line is connected to a source, and a second node is connected to a drain of an output; a second NMOS transistor (N2) in which a power supply line is connected to a gate, the first node is connected to one of a drain and a source, and a third node of the body of the first NMOS transistor (N1) is connected to the other of the drain and the source; a first PMOS transistor (P1) in which the first node of an input terminal is connected to a gate, the power supply line is connected to a source, and the third node is connected to a drain of an output; and a second PMOS transistor (P2) in which the GND line is connected to a gate, the first node is connected to one of a drain and a source, and a fourth node of the body of the first PMOS transistor (P1) is connected to the other of the drain and the source, wherein the GND line is connected to the body of the second NMOS transistor (N2) and wherein a VDD line is connected to the body of the second PMOS transistor (P2).

According to the configurations of the first to third aspects of the present invention, it is possible to realize a semiconductor integrated circuit device in which the power consumption is reduced in the static operation, as compared with the configuration in the related art.

That is, in the static operation, because the electric potential of the body of the second PMOS transistor (P2) is in the floating state in the circuit configuration in the circuit configuration of the related art, electrons generated by the impact ionization phenomenon in the vicinity of the drain region reach the body under a channel in the state of a high drain voltage. As the electric potential of the body gradually increases, a junction leakage current from the body to the source is generated to increase a current value. On the other hand, according to the configurations of the first to third aspects of the present invention, a body electrode is provided to control the electric potential of a body region to suppress the electric potential of the body to the VDD level. Thus, holes generated by the impact ionization phenomenon in the vicinity of the drain region are removed from the body region to suppress the electric potential of the body from increasing to reduce the junction leakage current to the source, thereby restraining the drain current of the second PMOS transistor from increasing. As a result, this can reduce the current consumption in the static operation and can reduce the current consumption of the whole circuit as compared with the current consumption of the whole circuit of the circuit configuration of the related art.

In order to achieve the above object, according to a fourth aspect of the present invention, there is provided a semiconductor integrated circuit device comprising: a first NMOS transistor (N1) in which a first node of an input terminal is connected to a gate, a GND line of a second node is connected to a source, and a third node is connected to a drain of an output; and a second NMOS transistor (N2) in which a power supply line of a fourth node is connected to a gate, the first node is connected to one of a drain and a source, and a fifth node of the body of the first NMOS transistor (N1) is connected to the other of the drain and the source, wherein the GND line is connected to sixth node of the body of the second NMOS transistor (N2).

According to the configuration of the fourth aspect of the present invention, it is possible to provide a DTMOS-NMOS transistor with a transistor for limiting a body voltage whose power consumption is further reduced in the static operation of the transient characteristic as compared with the DTMOS-NMOS transistor with a transistor for limiting a body voltage in the related art shown in FIG. 14.

In order to achieve the above object, according to a fifth aspect of the present invention, there is provided a semiconductor integrated circuit device comprising: a first PMOS transistor (P1) in which a first node of an input terminal is connected to a gate, a GND line of a second node is connected to a source, and a third node is connected to a drain of an output; and a second PMOS transistor (P2) in which a power supply line of a fourth node is connected to a gate, the first node is connected to one of a drain and a source, and a fifth node of the body of the first PMOS transistor (P1) is connected to the other of the drain and the source, wherein a VDD line is connected to the body of the second PMOS transistor (P2).

According to the configuration of the fifth aspect of the present invention, it is possible to provide a DTMOS-NMOS transistor with a transistor for limiting a body voltage whose power consumption is further reduced in the static operation of the transient characteristic as compared with the DTMOS-NMOS transistor with a transistor for limiting a body voltage in the related art shown in FIG. 15.

BRIEF DESCRIPTION OF THE DRAWINGS

FIG. 17 is a graph to show a signal waveform in the operation of each node in the circuit of a conventional configuration shown in FIG. 16.

DETAILED DESCRIPTION OF THE PREFERRED EMBODIMENTS

First embodiment

Figure 1:
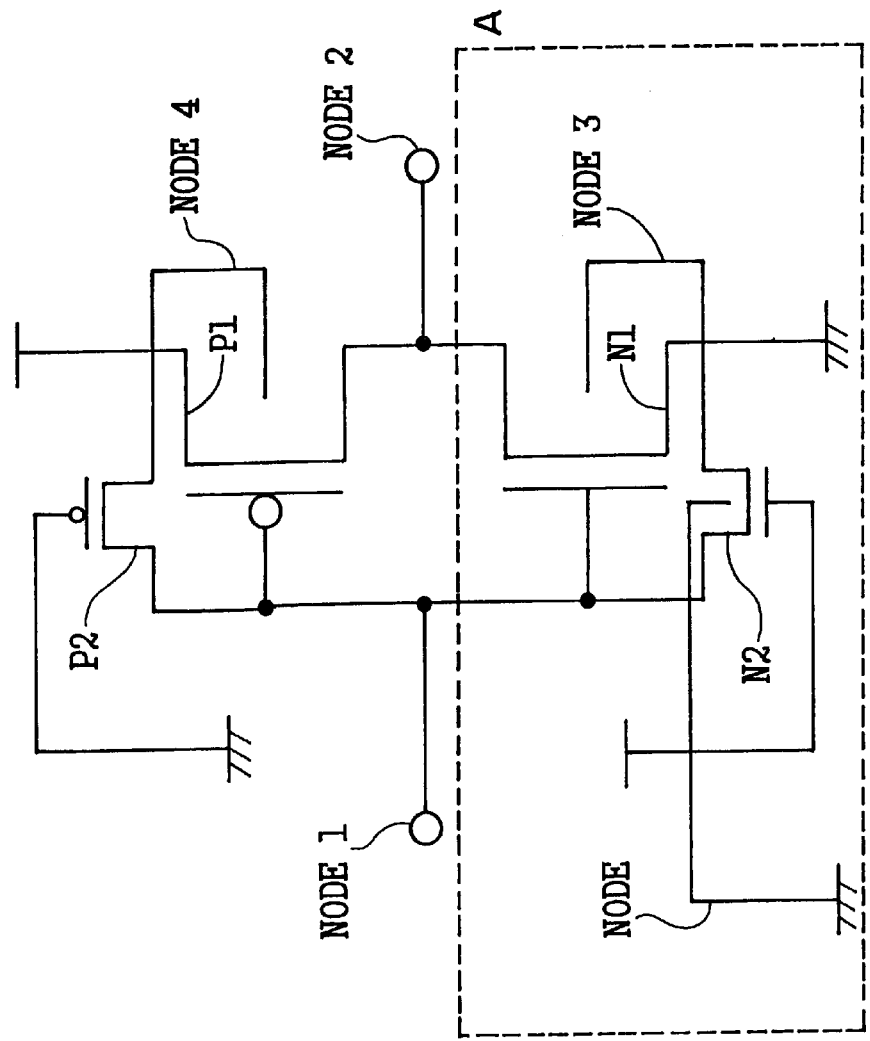
FIG. 1 is a circuit diagram to show a DTMOS inverter circuit in the first embodiment in accordance with the present invention.

FIG. 1 shows the first embodiment in accordance with the present invention. FIG. 1 shows a configuration in which the body of an NMOS transistor N2 is connected to a GND level in a conventional DMOS inverter shown in FIG. 16.

Figure 6:
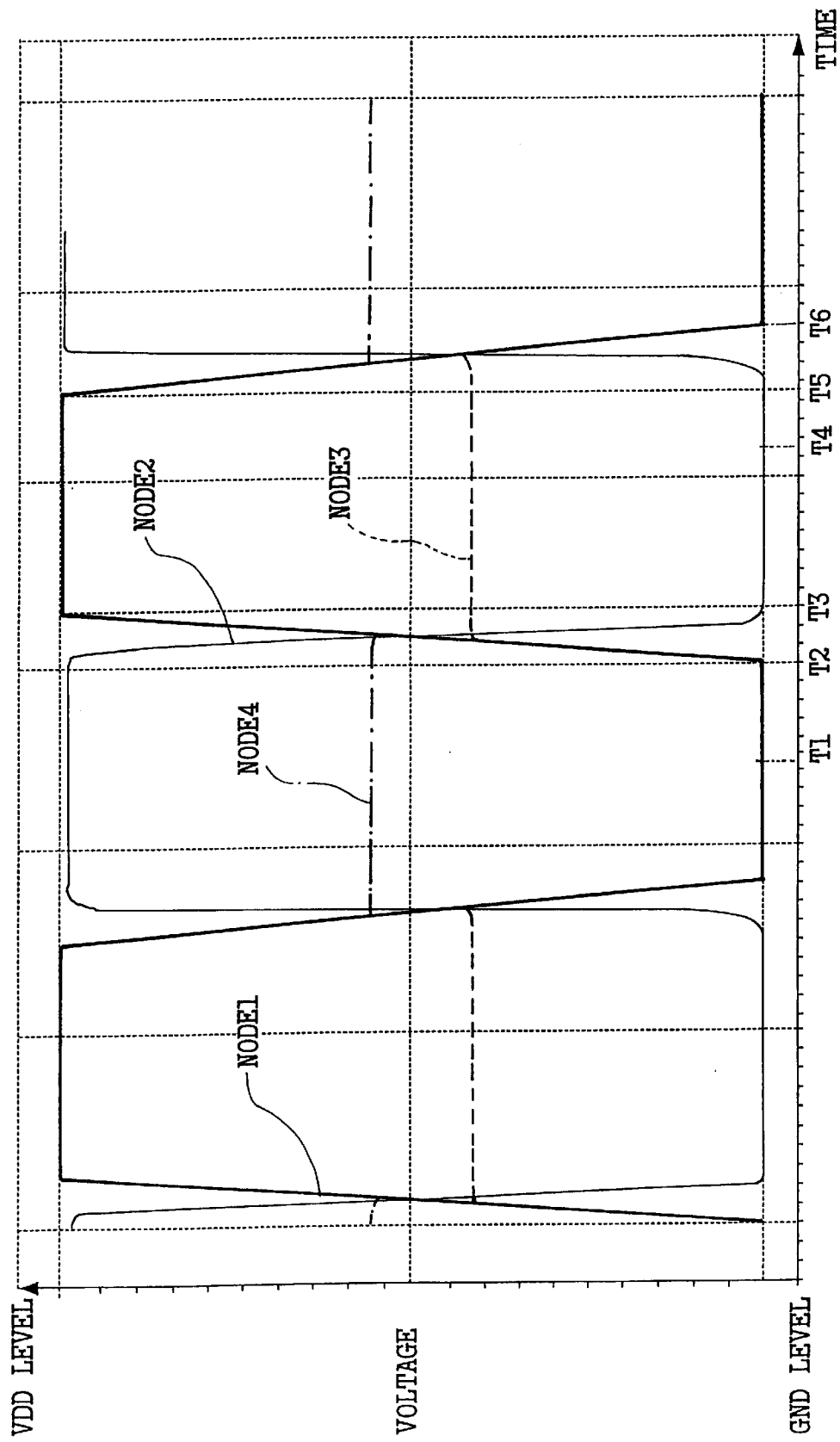
FIG. 6 is a graph to show a signal waveform in the operation of each node in the circuit of the configuration of the first embodiment shown in FIG. 1.

The operation of the first embodiment in accordance with the present invention shown in FIG. 1 will be described with reference to FIG. 6. In FIG. 6, signal waveforms are shown when a node 1, a node 2, a node 3 and a node 4 in a DTMOS inverter circuit in the first embodiment in accordance with the present invention are operated.

Figure 16:
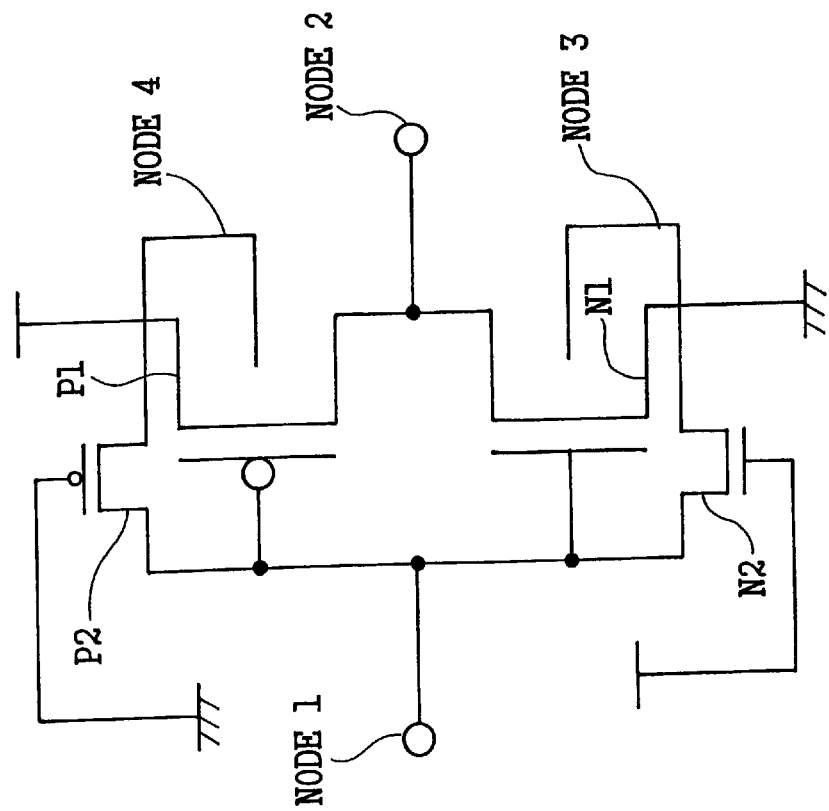
FIG. 16 is a circuit diagram to show the configuration of a conventional DTMOS inverter circuit.
Figure 18B:
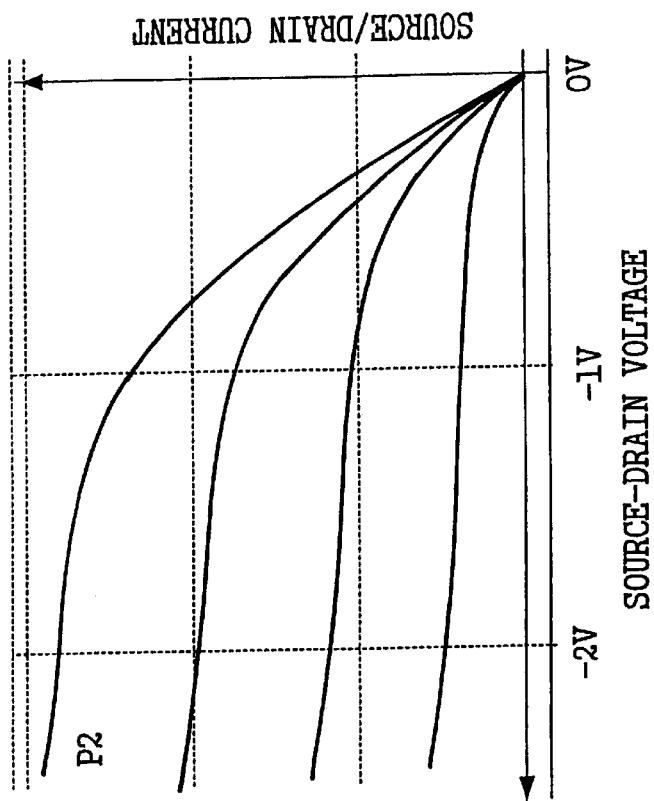
FIG. 18B is a graph to show a current-voltage characteristics of a PMOS transistor P2 in the circuit of a conventional configuration.
Figure 18A:
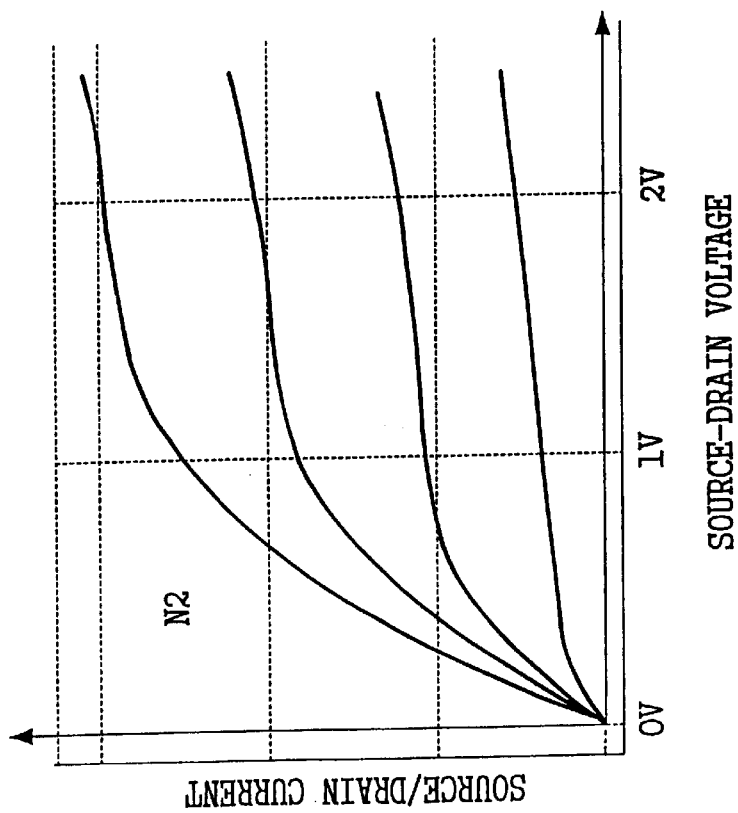
FIG. 18A is a graph to show a current-voltage characteristics of an NMOS transistor N2 in the circuit of a conventional configuration.

When the DTMOS inverter circuit is operated, a voltage not less than a built-in voltage (for example, 2.5 V) is inputted to the circuit as an input voltage as in the case of the conventional configuration shown in FIG. 16.

At a time T1, when the node 1 is at the GND level (for example, 0 V), an NMOS transistor N1 and an NMOS transistor N2 are in the OFF state and a PMOS transistor P1 and a PMOS transistor P2 are in the ON state. Therefore, the node 2 becomes a power source level (for example, 2 V). The node 3 becomes the GND level because the NMOS transistor N2 is in the OFF state. The voltage of the node 4 is limited by the PMOS transistor P2 and becomes the built-in voltage level (for example, 1.7 V) when viewed from the power source level.

During a period of time from T2 to T3, while the voltage of the node 1 gradually increases from the GND level to the power source level, the NMOS transistor N1 and the NMOS transistor N2 gradually reaches the state of ON and the PMOS transistor P1 reaches the state of OFF. During the period, the voltage of the node 2 which is at the power source level reaches the GND level gradually. Further, since the PMOS transistor P2 is in the ON state, as the node 1 gradually reaches a VDD level, the voltage of the node 4 is increased and gradually reaches the VDD level. The voltage of the node 3 is limited by the NMOS transistor N2 and thus the voltage of the node 3 becomes the built-in voltage level when viewed from the VDD level.

At the time T4, when the node 1 is at the VDD level, the NMOS transistor N1 and the NMOS transistor N2 are in the ON state and the PMOS transistor P1 and the PMOS transistor P2 are in the OFF state. At this time, the node 2 becomes the GND level and the node 4 becomes the GND level. Since the NMOS transistor N2 is in the ON state, the voltage of the node 3 is limited by the NMOS transistor N2 and becomes the built-in voltage level when viewed from the VDD level.

During a period of time from T5 to T6, while the voltage of the node 1 gradually reaches the GND level from the power source level, the NMOS transistor N1 and the NMOS transistor N2 gradually reach the state of OFF and the PMOS transistor P1 and the PMOS transistor P2 reach the state of ON. During this period of time, because the NMOS transistor N2 is in the ON state, as the node 1 gradually reaches the GND level, the voltage of the node 3 which is at the built-in voltage level is decreased and reaches the GND level gradually.

As described above, the first embodiment of the present invention is similar in the operation of the circuit to the conventional configuration, but is different in a current consumption in the static state at the time T4 from the conventional configuration.

Figure 7:
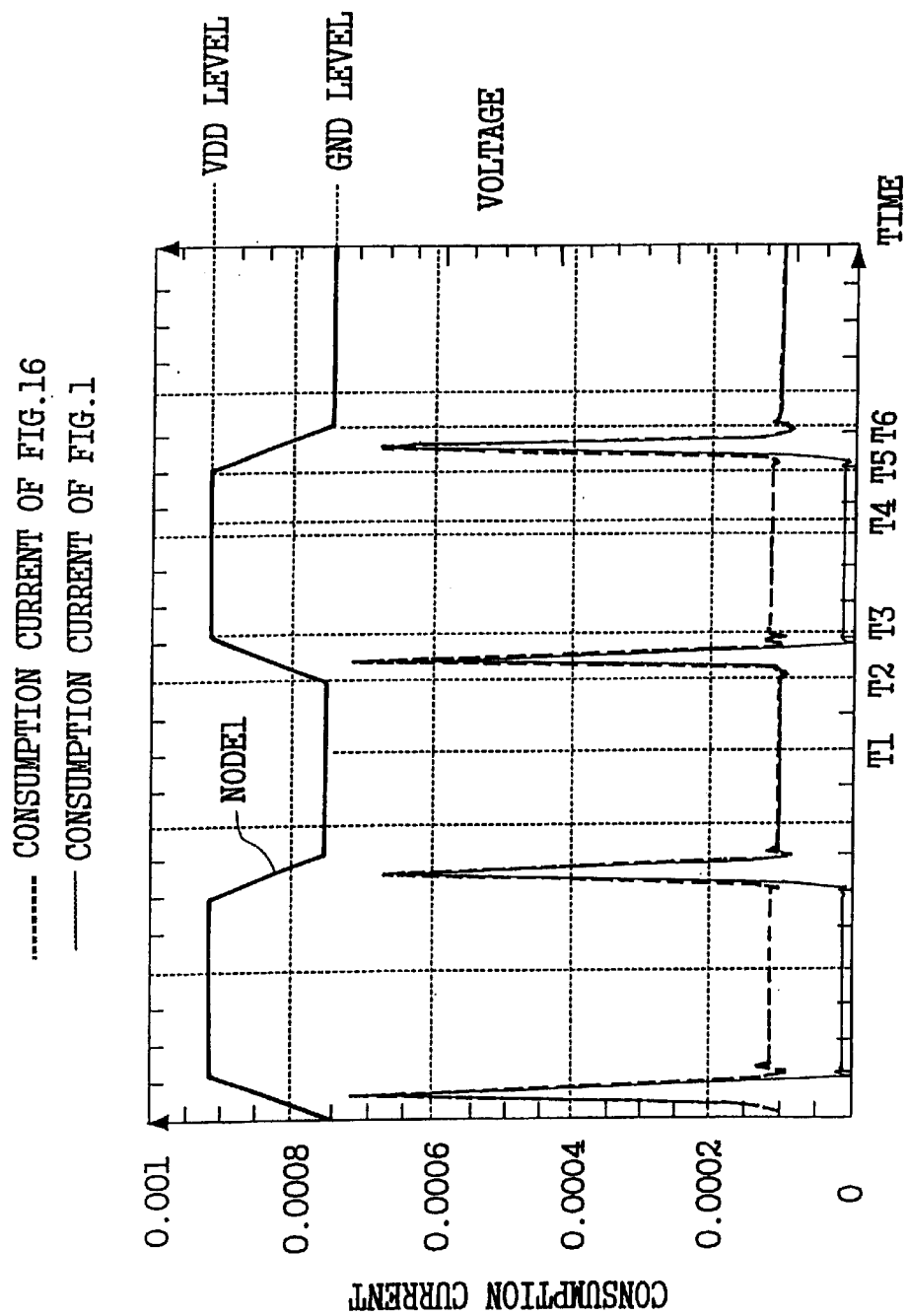
FIG. 7 is a graph to show a current consumption and an input waveform in the circuit of the configuration in the first embodiment shown in FIG. 1 and those in the circuit of the conventional configuration shown in FIG. 16.

FIG. 7 shows, on the scale of the left axis, the waveform of the current consumption of the whole circuit in the conventional circuit configuration shown in FIG. 16 and the waveform of the current consumption of the whole circuit in the first embodiment in accordance with the present invention shown in FIG. 1. In FIG. 7, the waveform of the node 1 is also shown on the scale of the right axis and on the same time scale. In the circuit configuration in the first embodiment in accordance with the present invention, a current consumption in the static operation is greatly decreased at the time T4. This can be explained by the difference in the current-voltage characteristics between the NMOS transistor N2 in the conventional circuit configuration shown in FIG. 16 and the NMOS transistor N2 in the circuit configuration in the first embodiment shown in FIG. 1.

Figure 8:
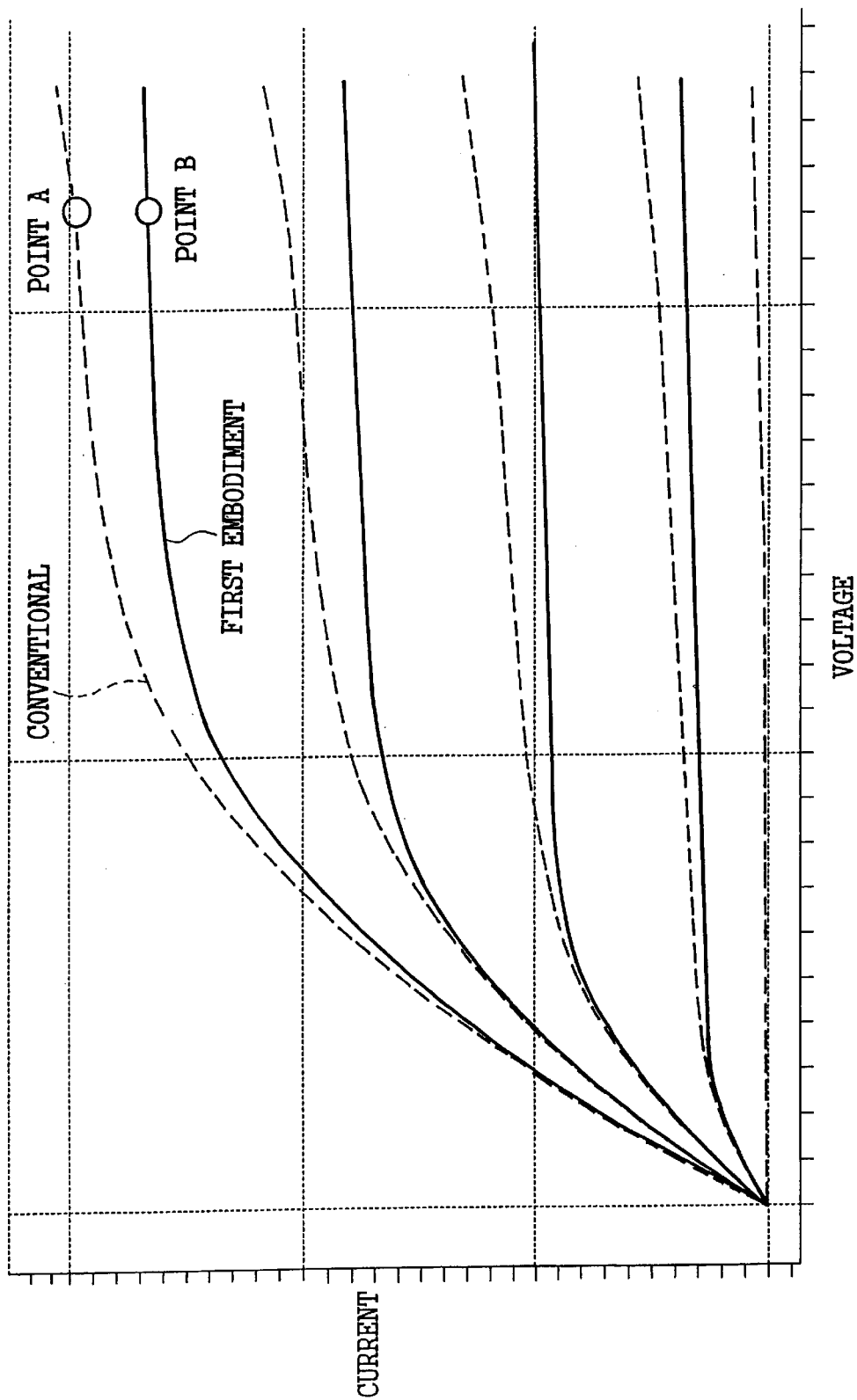
FIG. 8 is a graph to show the current-voltage characteristics of the NMOS transistor N2 in the circuit of the configuration of the first embodiment shown in FIG. 1 and those in the circuit of the conventional configuration shown in FIG. 16.
Figure 9:
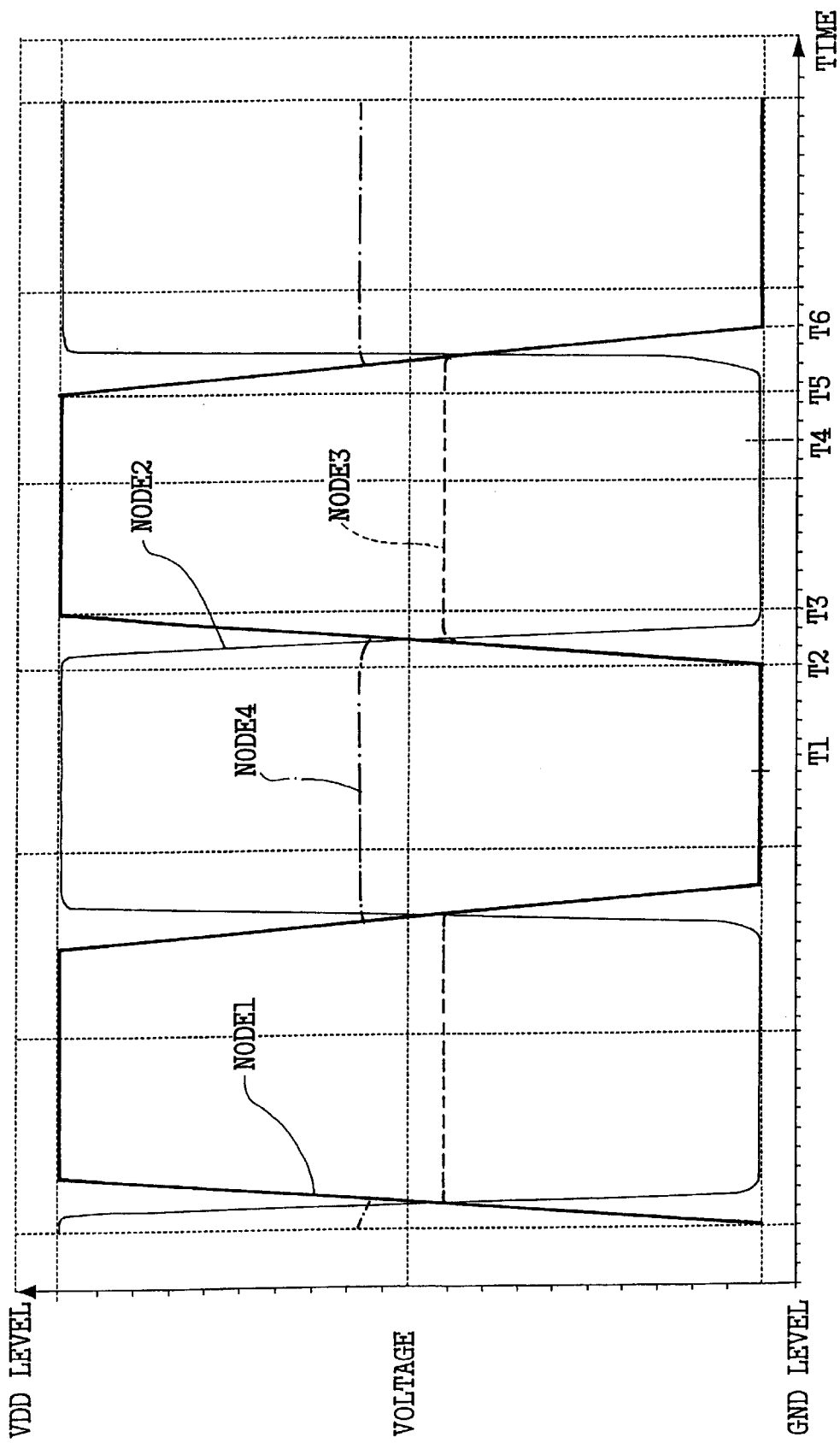
FIG. 9 is a graph to show a signal waveform in the operation of each node in the circuit of the configuration of the second embodiment shown in FIG. 2.

FIG. 8 shows the current-voltage characteristics (broken line) of the NMOS transistor N2 in the conventional circuit configuration and the current-voltage characteristics (solid line) of the NMOS transistor N2 in the circuit configuration in the first embodiment shown in FIG. 1. At the time T4, the VDD level is applied to the gate of the NMOS transistor N2, the GND level is applied to the source thereof, and the difference between the VDD level and the built-in voltage is applied to the drain thereof. Therefore, the current passing through the NMOS transistor N2 in the conventional circuit configuration corresponds to a point A, and the current passing through the NMOS transistor N2 in the circuit configuration of the first embodiment in accordance with present invention shown in FIG. 1 corresponds to a point B. When compared at these points, the current passing through the NMOS transistor N2 in the circuit configuration of the first embodiment in accordance with present invention is smaller than the current passing through the NMOS transistor N2 in the conventional circuit configuration. This difference in the current-voltage characteristics is due to the following reason.

Since the electric potential of the body of the NMOS transistor N2 in the conventional circuit configuration is in the floating state, holes generated by an impact ionization phenomenon in the vicinity of a drain region in the state of high drain voltage reach the body under a channel. As the electric potential of the body increases, a junction leakage current from the body to the source is generated to increase a current value.

Figure 4:
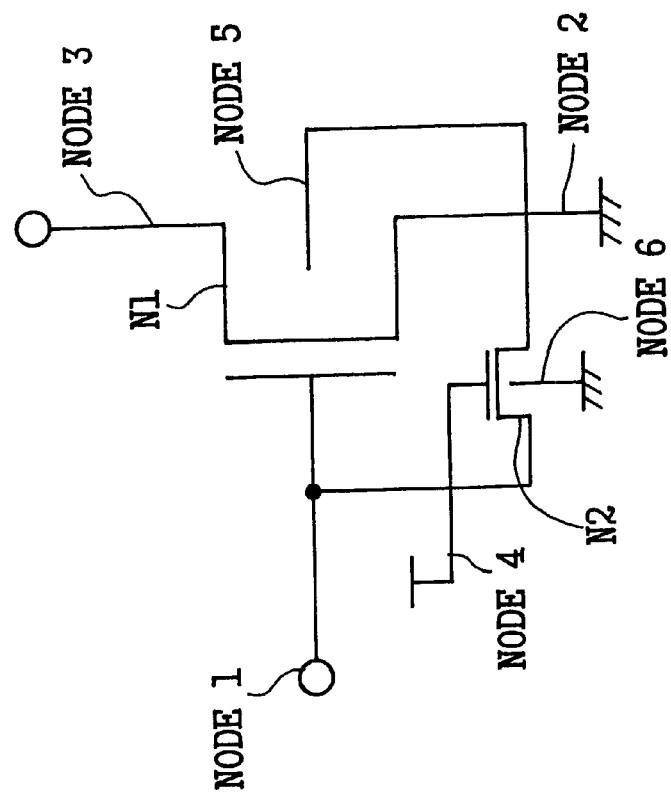
FIG. 4 is a circuit diagram to show a DTMOS-NMOS transistor of an NMOS transistor part (a region A in FIG. 1) in the first embodiment in accordance with the present invention.

On the other hand, in the first embodiment in accordance with the present invention, in order to control the electric potential of the body region, a body electrode (a node 6 in FIG. 4) is provided and the electric potential of the body is limited to the GND level. Therefore, the holes generated by the impact ionization phenomenon in the vicinity of the drain region are removed from the body region. As a result, the electric potential of the body is restrained from increasing and the junction leakage current to the source is decreased and the drain current of the NMOS transistor N2 is restrained from increasing. For the above reason, at the time T4, the power consumption of the whole circuit in the first embodiment in accordance with present invention shown in FIG. 1 can be made smaller than the power consumption of the whole circuit in the conventional circuit configuration shown in FIG. 16.

As described above in detail, according to the present invention, in the first embodiment in accordance with the present invention, by adopting a configuration in which the body of the NMOS transistor N2 is connected to the GND level in the conventional DMOS inverter configuration shown in FIG. 16, the current consumption in the static operation at the time T4, that is, the power consumption of the whole circuit can be greatly decreased.

Second Embodiment

Figure 2:
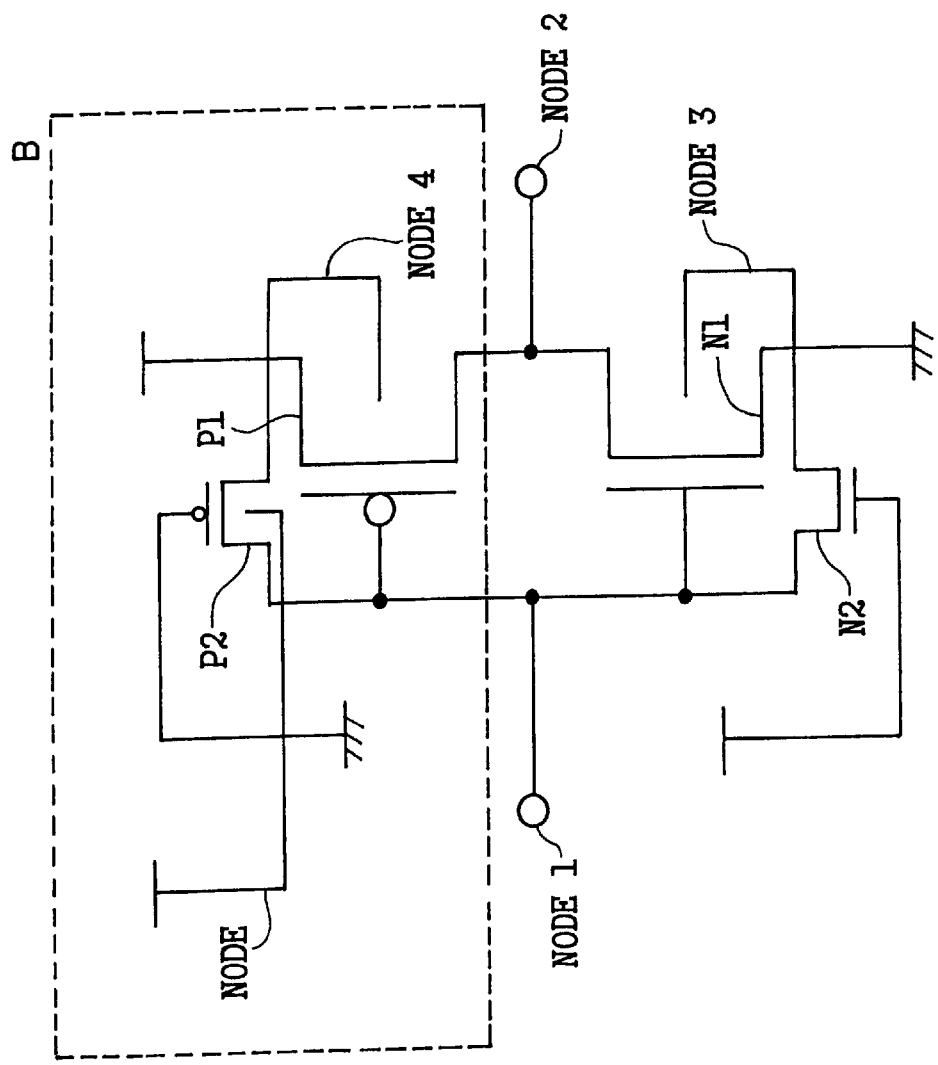
FIG. 2 is a circuit diagram to show a DTMOS inverter circuit in the second embodiment in accordance with the present invention.

FIG. 2 shows the second embodiment in accordance with the present invention. FIG. 2 shows a configuration in which the body of the PMOS transistor P2 is connected to the VDD level in the conventional DMOS inverter configuration shown in FIG. 16.

The operation of the DTMOS inverter circuit and the signal waveforms in the operations of the respective node 1, node 2, node 3 and node 4 in the second embodiment in accordance with the present invention shown in FIG. 2 are the same as the operation and signal waveforms in the first embodiment, that is, the operation and signal waveforms in the conventional configuration, but the current consumption at the static state at the time T1 in the second embodiment is different from that in the conventional configuration.

Figure 10:
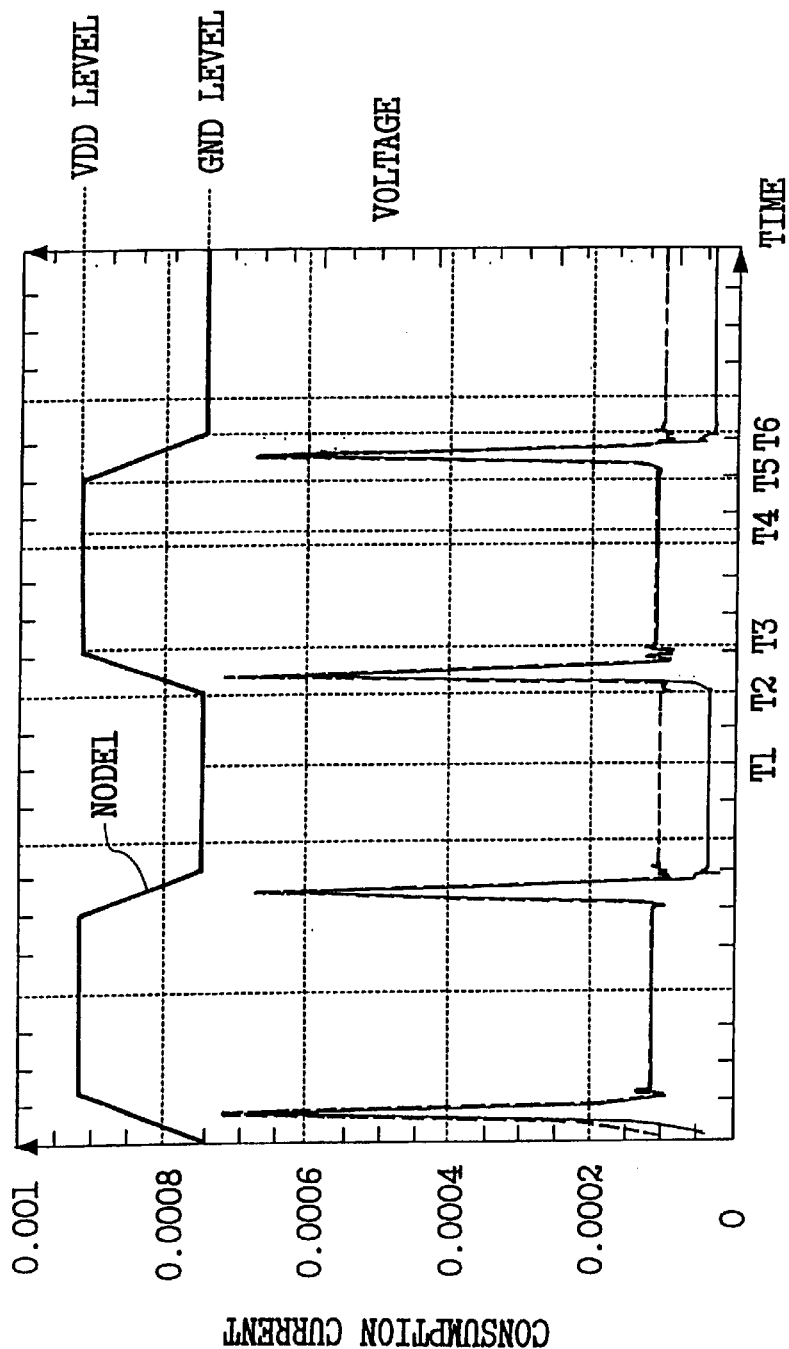
FIG. 10 is a graph to show a current consumption and an input waveform in the circuit of the configuration of the second embodiment shown in FIG. 2 and those in the circuit of the conventional configuration shown in FIG. 16.

FIG. 10 shows, on the scale of the left axis, the waveform of the current consumption of the whole circuit in the conventional circuit configuration shown in FIG. 16 and the waveform of the current consumption of the whole circuit in the second embodiment in accordance with the present invention shown in FIG. 2. In FIG. 10, the waveform of the node 1 is also shown on the scale of the right axis and on the same time scale. In the circuit configuration in the second embodiment in accordance with the present invention, the current consumption in the static operation is greatly decreased at the time T1.

Because the operation is in the static state at the time T1, this can be explained by the difference in the current-voltage characteristics between the PMOS transistor P2 in the conventional circuit configuration shown in FIG. 16 and the PMOS transistor P2 in the second embodiment shown in FIG. 2.

Figure 11:
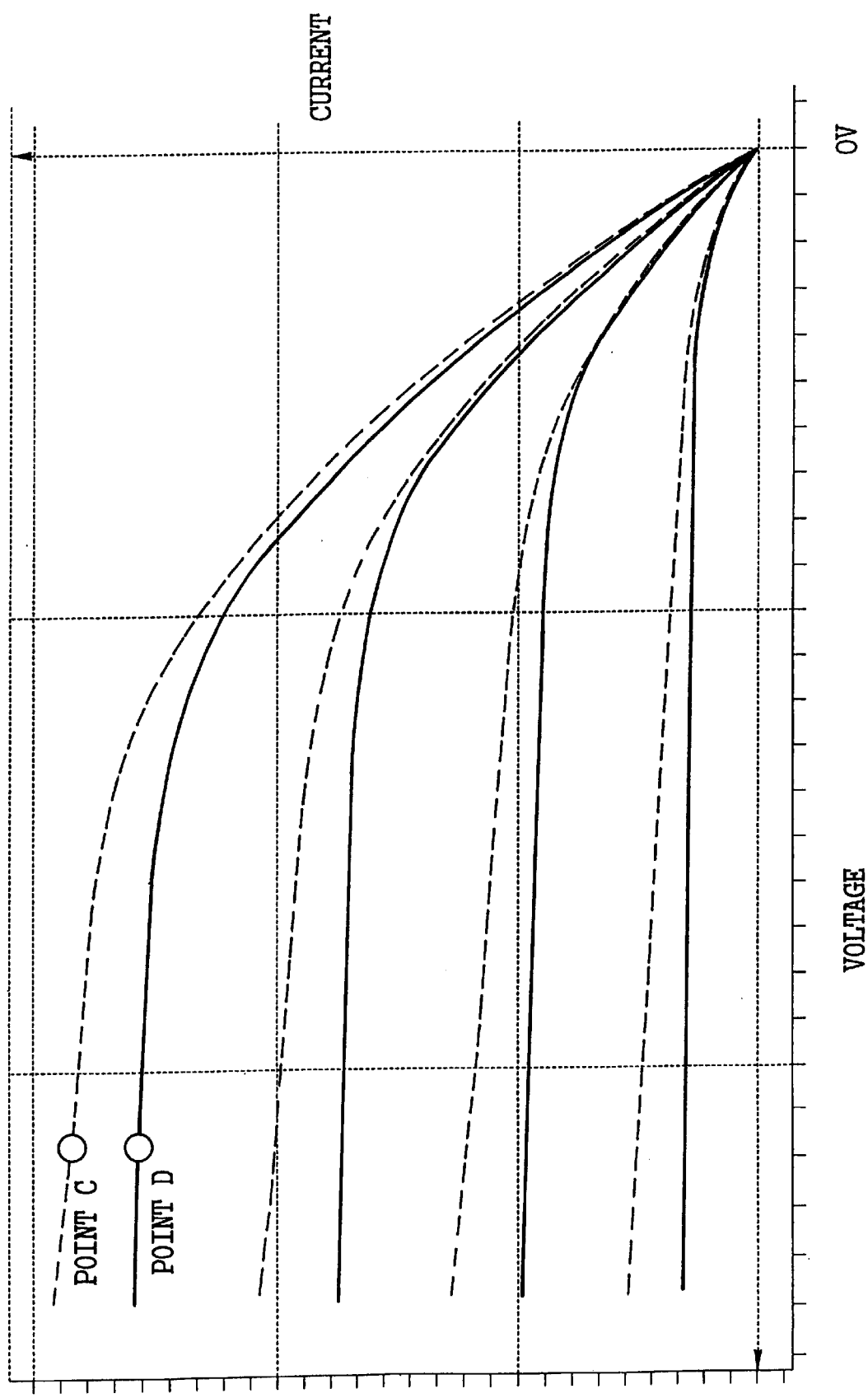
FIG. 11 is a graph to show the current-voltage characteristics of the PMOS transistor P2 in the circuit of the configuration of the second embodiment shown in FIG. 2 and those in the circuit of the conventional configuration shown in FIG. 16.
Figure 12:
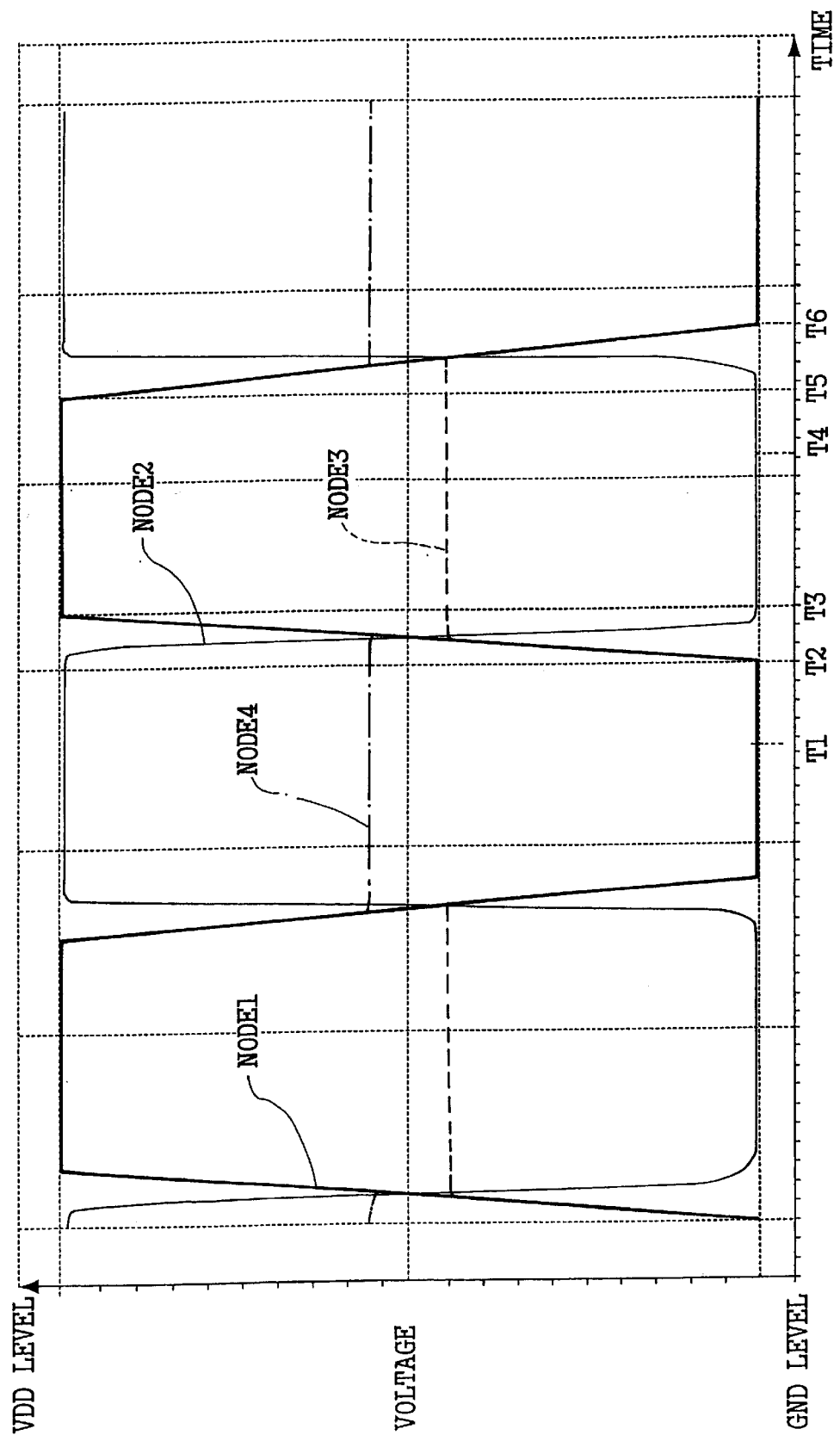
FIG. 12 is a graph to show a signal waveform in the operation of each node in the circuit of the configuration of the third embodiment shown in FIG. 3.

FIG. 11 shows the current-voltage characteristics (broken line) of the PMOS transistor P2 in the conventional circuit configuration and the current-voltage characteristics (solid line) of the PMOS transistor P2 in the second embodiment shown in FIG. 2. At the time T1, the GND level is applied to the gate of the PMOS transistor P2, the VDD level is applied to the source thereof, and the difference between the VDD level and the built-in voltage when viewed from the VDD level is applied to the drain thereof. Therefore, the current passing through the PMOS transistor P2 in the conventional circuit configuration corresponds to a point C, and the current passing through the PMOS transistor P2 in the circuit configuration in the second embodiment in accordance with present invention shown in FIG. 2 corresponds to a point D. When compared at these points, the current passing through the PMOS transistor P2 in the circuit configuration in the second embodiment in accordance with present invention is smaller than the current passing through the PMOS transistor P2 in the conventional circuit configuration. This difference in the current-voltage characteristics is ascribed to the following reason.

Since the electric potential of the body of the PMOS transistor P2 in the conventional circuit configuration is in the floating state, electrons generated by an impact ionization phenomenon in the vicinity of a drain region in the state of high drain voltage reach the body under a channel. As the electric potential of the body is increased, a junction leakage current from the body to a source is generated to increase a current value.

Figure 5:
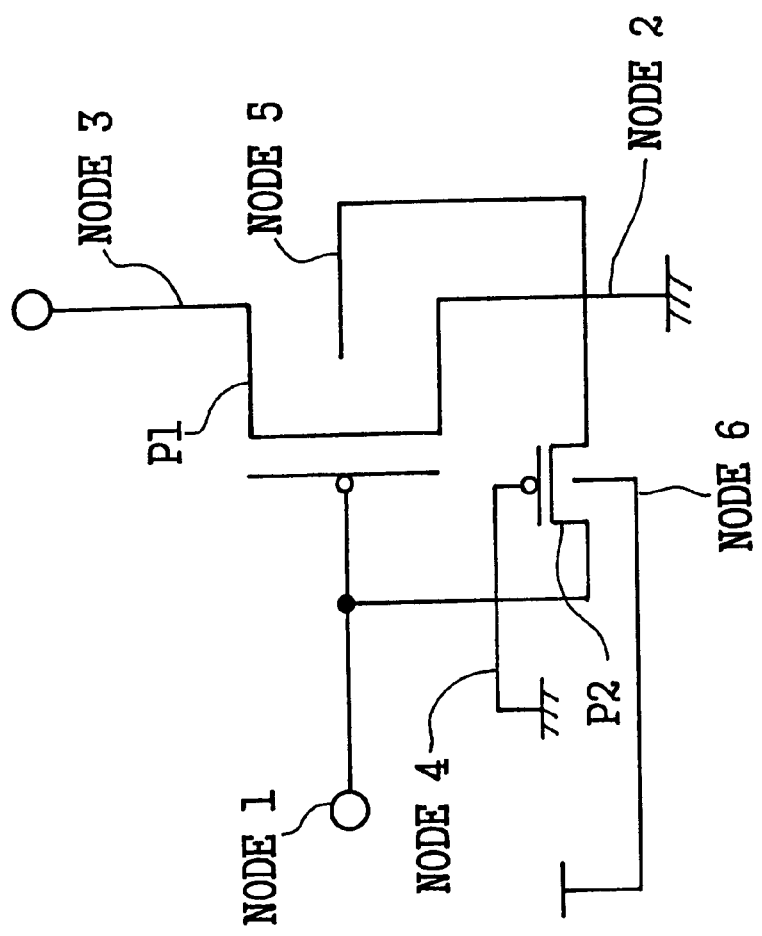
FIG. 5 is a circuit diagram to show a DTMOS-PMOS transistor of a PMOS transistor part (a region B in FIG. 2) in the first embodiment in accordance with the present invention.

On the other hand, in the second embodiment in accordance with the present invention, in order to control the electric potential of the body region, a body electrode (a node 6 in FIG. 5) is provided and the electric potential of the body is limited to the VDD level. Therefore, the electrons generated by the impact ionization phenomenon in the vicinity of the drain region are removed from the body region. As a result, the electric potential of the body is restrained from increasing and the junction leakage current to the source is decreased and the drain current of the PMOS transistor P2, which occurs in the conventional circuit configuration (as described above) is restrained from increasing. For the above reason, at the time T1, the power consumption of the whole circuit configuration in the second embodiment in accordance with present invention can be made smaller than the power consumption of the whole circuit in the conventional circuit configuration shown in FIG. 16.

As described above in detail, in the second embodiment in accordance with the present invention, by adopting a configuration in which the body of the PMOS transistor P2 is connected to the VDD level in the conventional DMOS inverter configuration shown in FIG. 16, the current consumption in the static operation at the time T1, that is, the power consumption of the whole circuit can be greatly decreased.

Third Embodiment

Figure 3:
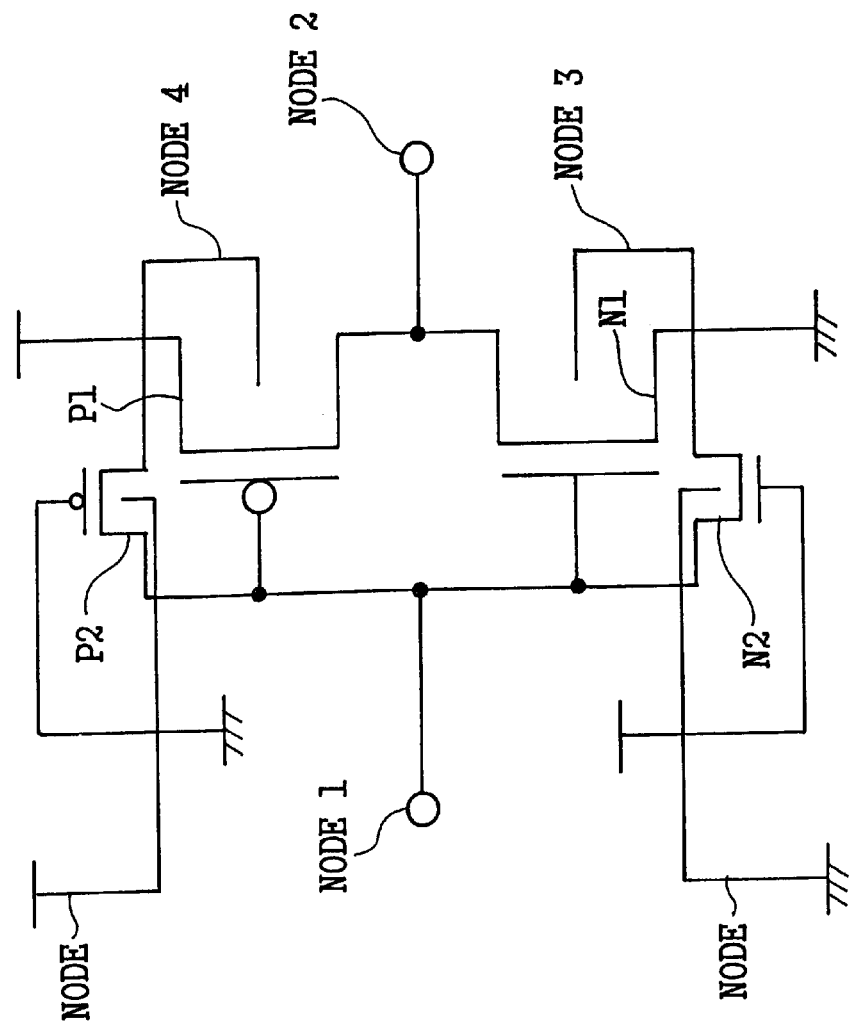
FIG. 3 is a circuit diagram to show a DTMOS inverter circuit in the third embodiment in accordance with the present invention.

FIG. 3 shows the third embodiment in accordance with the present invention. FIG. 3 shows a configuration in which the body of the NMOS transistor N2 is connected to the GND level and the body of the PMOS transistor P2 is connected to the VDD level in the configuration of the conventional DMOS inverter shown in FIG. 16.

The signal waveform in the operation of the DTMOS inverter circuit and the signal waveforms in the operations of the respective node 1, node 2, node 3 and node 4 in the third embodiment in accordance with the present invention shown in FIG. 3 are the same as the operations and signal waveforms in the first and the second embodiments, that is, the operation and signal waveforms of the conventional configuration, but the current consumption in the static state at the time T1 and the time T4 in the third embodiment is different from that in the conventional configuration.

Figure 13:
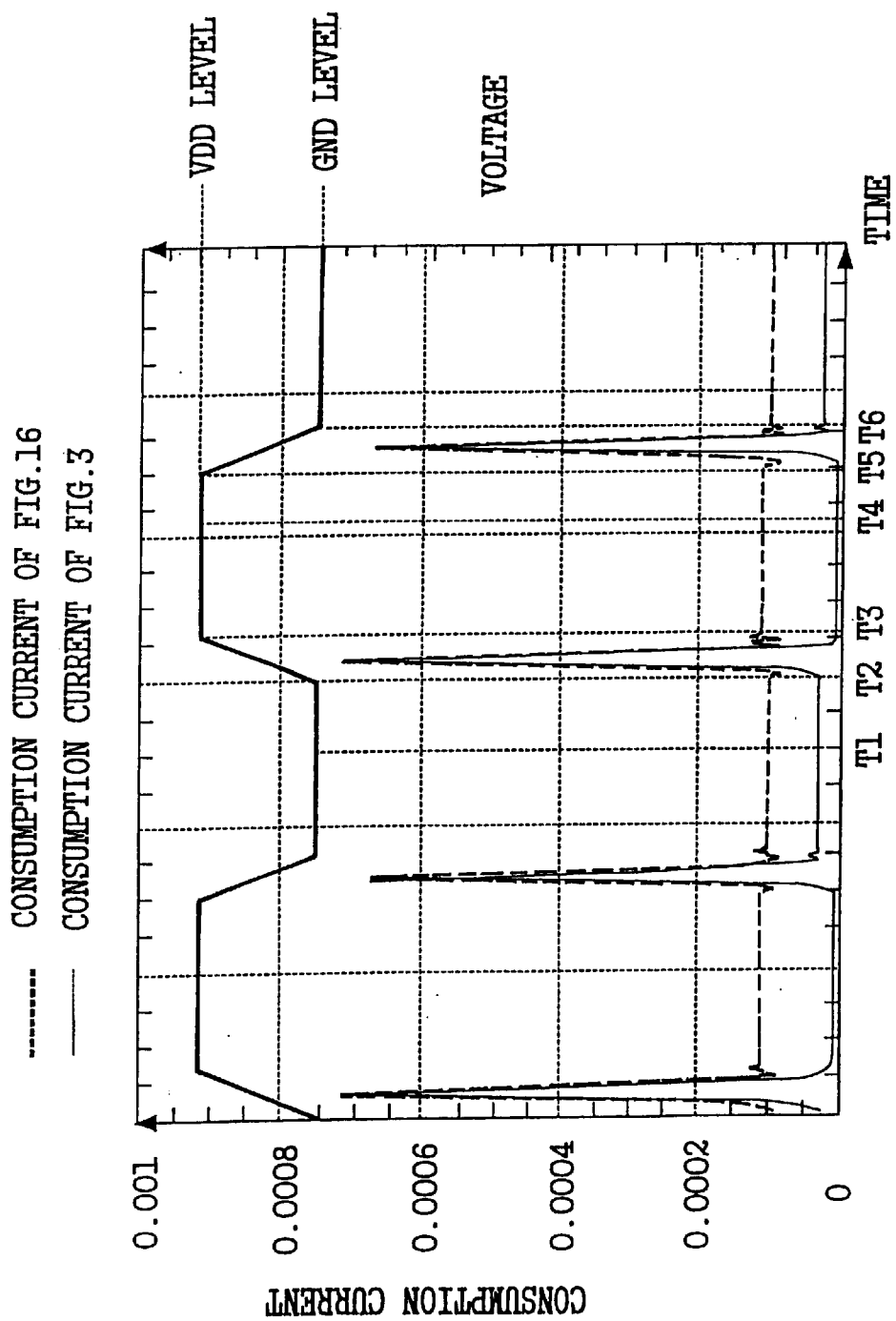
FIG. 13 is a graph to show a current consumption and an input waveform in the circuit of the configuration of the third embodiment shown in FIG. 3 and those in the circuit of the conventional configuration shown in FIG. 16.
Figure 14:
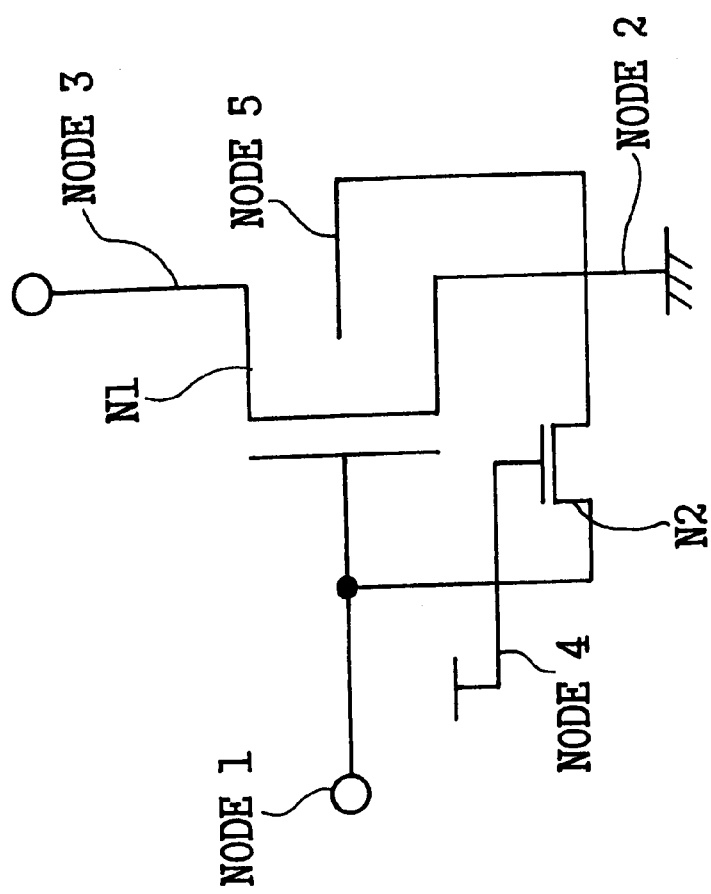
FIG. 14 is a circuit diagram to show a conventional DTMOS-NMOS transistor with a transistor for limiting a body voltage.
Figure 15:
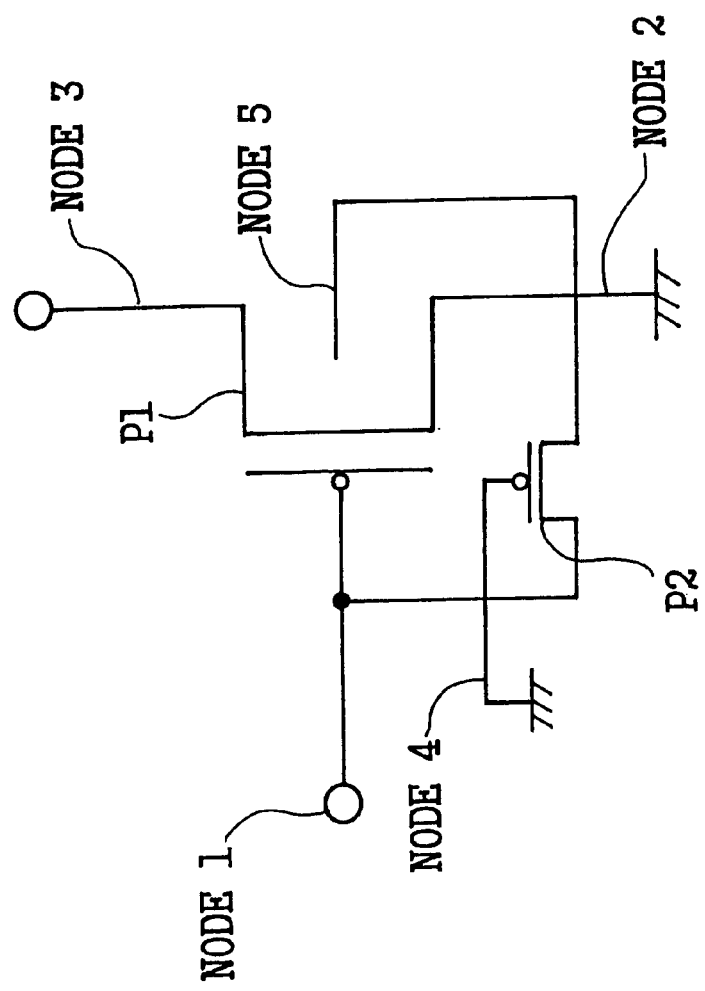
FIG. 15 is a circuit diagram to show a conventional DTMOS-PMOS transistor with a transistor for limiting a body voltage.

FIG. 13 shows, on the scale of the left axis, the waveform of the current consumption of the whole circuit in the conventional circuit configuration shown in FIG. 16 and the waveform of the current consumption of the whole circuit in the third embodiment in accordance with the present invention shown in FIG. 3. In FIG. 13, the waveform of the node 1 is also shown on the scale of the right axis and on the same time scale. In the circuit configuration in the third embodiment in accordance with the present invention, the current consumption in the static operation is greatly decreased at the times T1 and T4.

As described above in detail, in the third embodiment in accordance with the present invention, by adopting a configuration in which the body of the NMOS transistor N2 is connected to the GND level and the body of the PMOS transistor P2 is connected to the VDD level in the conventional DMOS inverter configuration shown in FIG. 16, the current consumption in the static operation at the time T1 and the time T4, that is, the power consumption of the whole circuit can be greatly decreased.

What is claimed is:

1. A semiconductor integrated circuit device comprising:

an input terminal which includes a first node;

an output which includes a second node;

a first NMOS transistor having a gate connected to the first node, a source connected to ground, a drain connected to the second node, and a body which includes a third node;

a second NMOS transistor having a gate connected to a power supply line, and a drain and source of which one is connected to the first node and the other is connected to the third node;

a first PMOS transistor having a gate connected to the first node, a source connected to the power supply line, a drain connected to the second node, and a body which includes a fourth node; and a second PMOS transistor having a gate connected to ground, and a drain and source of which one is connected to the first node and the other is connected to the fourth node, wherein the second NMOS transistor further has a body connected to ground.

2. A semiconductor integrated circuit device comprising:

an input terminal which includes a first node;

an output which includes a second node;

a first NMOS transistor having a gate connected to the first node, a source connected to ground, a drain connected to the second node, and a body which includes a third node;

a second NMOS transistor having a gate connected to a power supply line, and a drain and source of which one is connected to the first node and the other is connected to the third node;

a first PMOS transistor having a gate connected to the first node, a source connected to the power supply line, a drain connected to the second node, and a body which includes a fourth node; and a second PMOS transistor having a gate connected to ground, and a drain and source of which one is connected to the first node and the other is connected to the fourth node, wherein the second PMOS transistor further has a body connected to a supply voltage line.

3. A semiconductor integrated circuit device comprising:

an input terminal which includes a first node;

an output which includes a second node;

a first NMOS transistor having a gate connected to the first node, a source connected to ground, a drain connected to the second node, and a body which includes a third node;

a second NMOS transistor having a gate connected to a power supply line, and a drain and source of which one is connected to the first node and the other is connected to the third node;

a first PMOS transistor having a gate connected to the first node, a source connected to the power supply line, a drain connected to the second node, and a body which includes a fourth node; and a second PMOS transistor having a gate connected to ground, and a drain and source of which one is connected to the first node and the other is connected to the fourth node, wherein the second NMOS transistor further has a body connected to ground, and the second PMOS transistor further has a body connected to a supply voltage line.

4. A semiconductor integrated circuit device comprising:

an input terminal which includes a first node;

a ground line which includes a second node;

an output which includes a third node;

a power supply line which includes a fourth node;

a first NMOS transistor having a gate connected to the first node, a source connected to the second node, a drain connected to the third node, and a body which includes a fifth node; and a second NMOS transistor having a gate connected to the fourth node, a drain and source of which one is connected to the first node and the other is connected to the fifth node, and a body which includes a sixth node, wherein the sixth node is connected to ground.

5. A semiconductor integrated circuit device comprising:

an input terminal which includes a first node;

a ground line which includes a second node;

an output which includes a third node;

another ground line which includes a fourth node;

a first PMOS transistor having a gate connected to the first node, a source connected to the second node, a drain connected to the third node, and a body which includes a fifth node; and a second PMOS transistor having a gate connected to the fourth node, a drain and source of which one is connected to the first node and the other is connected to the fifth node, and a body which includes a sixth node wherein the sixth node is connected to a supply voltage line.

* * * * *